United States Patent
Wagoner et al.

(10) Patent No.: US 9,444,448 B2
(45) Date of Patent: Sep. 13, 2016

(54) HIGH PERFORMANCE IGBT GATE DRIVE

(71) Applicant: General Electric Company, Schenectady, NY (US)

(72) Inventors: Robert Gregory Wagoner, Roanoke, VA (US); Allen Michael Ritter, Roanoke, VA (US); Harold Robert Schnetzka, Simpsonville, SC (US)

(73) Assignee: General Electric Company, Schenectady, NY (US)

( * ) Notice: Subject to any disclaimer, the term of this patent is extended or adjusted under 35 U.S.C. 154(b) by 173 days.

(21) Appl. No.: 14/101,579

(22) Filed: Dec. 10, 2013

(65) Prior Publication Data

US 2015/0162905 A1    Jun. 11, 2015

(51) Int. Cl.
| | |
|---|---|
| H03K 17/60 | (2006.01) |
| H03K 17/567 | (2006.01) |
| H02M 1/08 | (2006.01) |
| H03K 17/0412 | (2006.01) |
| H03K 17/16 | (2006.01) |

(52) U.S. Cl.
CPC ............ *H03K 17/567* (2013.01); *H02M 1/08* (2013.01); *H03K 17/0412* (2013.01); *H03K 17/168* (2013.01)

(58) Field of Classification Search
CPC .................. H01L 2924/00; H01L 2924/0002; H01L 2924/13055; H03K 17/168; H03K 17/0828
See application file for complete search history.

(56) References Cited

U.S. PATENT DOCUMENTS

| | | | |
|---|---|---|---|
| 6,208,185 B1 | 3/2001 | John et al. | |
| 6,687,106 B1* | 2/2004 | Tanaka | ................ H01L 27/0251 361/101 |
| 7,710,187 B2* | 5/2010 | Hiyama | ........................ 327/374 |
| 2006/0044025 A1* | 3/2006 | Grbovic | ............. H03K 17/0406 327/112 |
| 2010/0301784 A1* | 12/2010 | Tagome | ................... H02M 1/28 318/139 |
| 2011/0133790 A1* | 6/2011 | Nagata | .................. H03K 17/168 327/109 |
| 2011/0228564 A1 | 9/2011 | Uruno et al. | |
| 2012/0032710 A1* | 2/2012 | Tsukada | ............. H03K 17/0828 327/109 |
| 2013/0021067 A1 | 1/2013 | Lee et al. | |
| 2013/0278298 A1 | 10/2013 | Curbelo et al. | |

OTHER PUBLICATIONS

EiceDRIVER™ Application Note, Feb. 28, 2012, 26 pages.
EiceDRIVER™ Industrial Power Control Final Data Sheet 1ED020I112-FT, Jul. 31, 2012, 32 Pages.
Chokhawala et al., "Gate Drive Considerations for IGBT Modules", IEEE Transactions on Industry Applications, vol. 31, Issue 3, May/Jun. 1995, pp. 1186-1195.

(Continued)

Primary Examiner — Sibin Chen
(74) Attorney, Agent, or Firm — Dority & Manning, P.A.

(57) ABSTRACT

High performance gate drives and methods for driving semiconductor switching elements, such as insulated gate bipolar transistors (IGBTs), are provided. The gate drive can control the voltage applied to the gate of the IGBT to one or more intermediate voltages near the threshold voltage of the IGBT to control dv/dt of the collector-emitter voltage during and the di/dt of the collector current turn off. For instance, a voltage level between the turn on voltage and the turn off voltage can be applied for a first time period to control dv/dt of the collector-emitter voltage and di/dt of the collector current during turn off. Another voltage level between the turn on voltage and the turn off voltage can be applied for a second time period during reverse recovery of a freewheeling diode coupled in parallel with the IGBT.

18 Claims, 6 Drawing Sheets

(56) References Cited

OTHER PUBLICATIONS

Heer et al., "Simple Turn-Off Description of Trench-Field-Stop IGBT-IGBT$^3$/3.3kV", PCIM Power Electronic Conference, vol. 2, Nuremburg, Germany, May 8-10, 2012—6 pages.

Hong et al., "Robustness Improvement of High-Voltade IGBT by Gate Control", Infineon Technologies, 3 pages.

Infineon, Application Note "Switching Behavior and Optimal Driving of IGBT$^3$ Modules", www.eupec.com—6 pages.

Luniewski et al, "Dynamic Voltage Rise Control, the Most Efficient Way to Control Turn-off Switching Behaviour of IGBT Transistors", Pelincec Conference, Oct. 16-19, 2005, Warsaw, Poland, pp. 80-86.

Rahimo et al., "Freewheeling Diode Reverse Recovery Failure Modes in IGBT Applications", IEEE Transaction on Industry Applications, vol. 37, Issue 2, Mar./Apr. 2001, pp. 661-670.

European Search Report and Opinion issued in connection with corresponding EP Application No. 14194497 on Apr. 24, 2015.

* cited by examiner

HIGH PERFORMANCE IGBT GATE DRIVE

FIELD OF THE INVENTION

The present disclosure relates generally to gate drive circuits for semiconductor devices, and more particularly to gate drive circuits for insulated gate bipolar transistors (IGBTs).

BACKGROUND OF THE INVENTION

Semiconductor devices such as IGBTs can be used in many electrical systems as electronic switching elements for a variety of applications. For instance, IGBTs can be used in bridge circuits of a power converter to convert alternating current (AC) power to direct current (DC) power, and vice versa. Often a freewheeling diode is coupled in parallel with the IGBT to control current flow in, for instance, a bridge circuit.

IGBTs typically include three terminals, including a gate, a collector, and an emitter. The IGBT can be operated as a switching element by controlling the gate-emitter voltage using a gate drive circuit. For instance, when the gate-emitter voltage exceeds a threshold voltage for the IGBT, the IGBT can be turned on such that current can flow through the collector and emitter of the IGBT. When the gate-emitter voltage is less than the threshold voltage for the IGBT, the IGBT can be turned off such that current flow through the collector and emitter is limited.

During operation of the IGBT, it is important to turn the IGBT on and off quickly to reduce turn-off loss. Reducing the turn-off gate resistance associated with the IGBT can allow the IGBT to turn off quicker. During typical IGBT turn off, a parasitic miller capacitance from the gate-collector works in conjunction with the turn-off gate resistance to control the rate of voltage changes (dv/dt) of the collector-emitter voltage. However, a typical IGBT structure has inherent properties that limit the speed at which an IGBT can be turned off. More particularly, as explained in more detail below, when the gate-emitter voltage is negative with respect to a drift region of the IGBT, an adjoining drift region to a gate oxide layer tends toward inversion and becomes a shunt for displacement charge from the collector through the shunt to the emitter.

Figure 1:
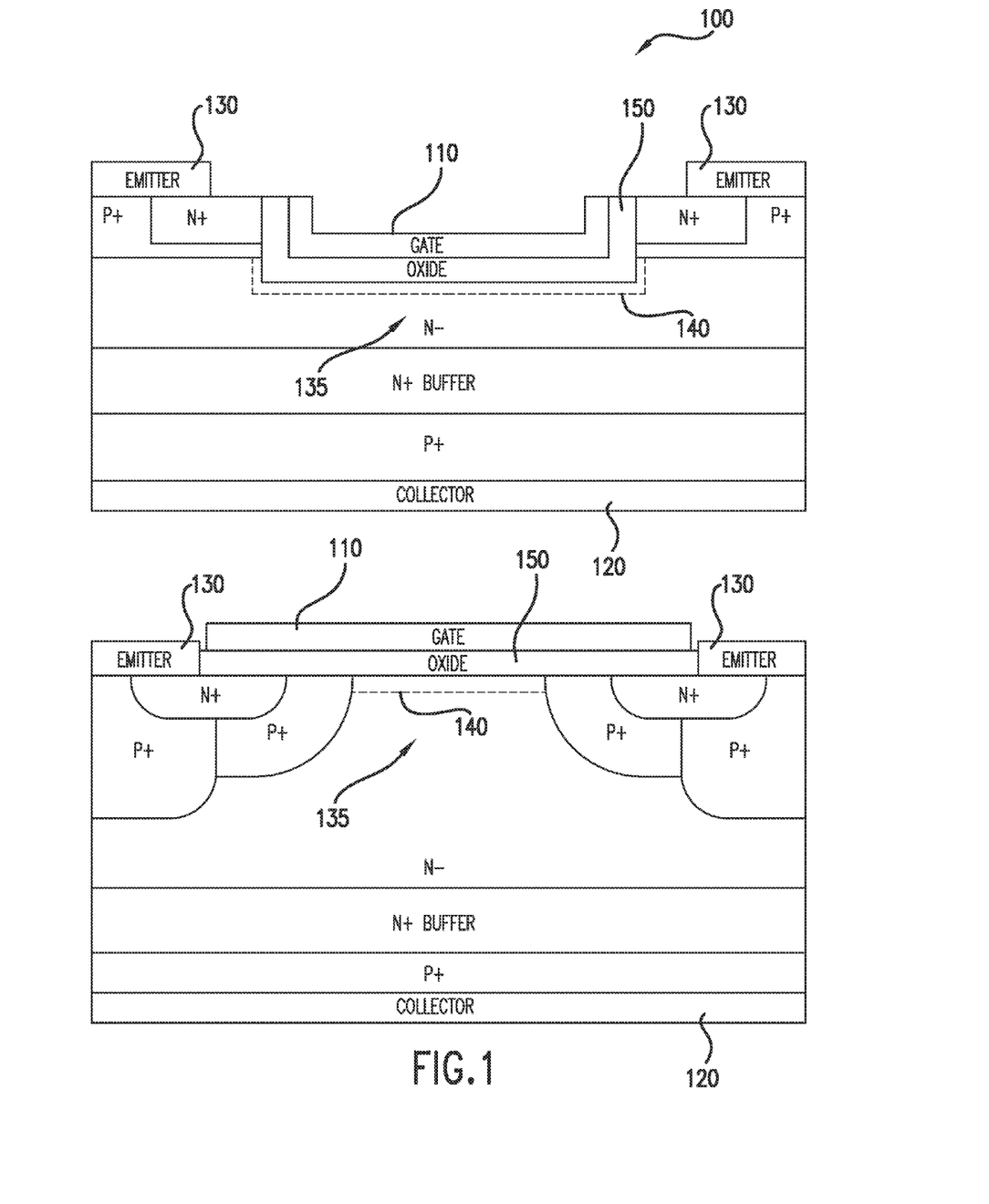
FIG. 1 depicts example IGBT structures.

For instance, FIG. 1 depicts a plurality of example IGBT structures 100 that can be used in a variety of applications. The example IGBT structures 100 are provided for purposes of illustration and discussion. As shown, each IGBT structure 100 includes a gate 110, a collector 120, and an emitter 130. A gate oxide layer 150 is located adjacent to the gate 110.

Each IGBT structure 100 can include a drift region 135 where under blocking conditions, the majority of the voltage is accumulated. For increasing blocking on the IGBT, displacement current can flow to the gate 110 unless the gate 110 becomes oppositely biased with respect to the emitter 130, at which point that negative bias will force the like polarity carriers out of the drift region 135 away from the proximity of the gate oxide layer 150. Displacement currents then can use the channel 140 that is formed to the emitter 130, rather than using the gate drive as a way to travel to the emitter 130. The channel 140 that is formed provides a path or "shunt" connecting to a P+ region adjacent to the emitter 130. Having an inverted charge in the N− region near the gate oxide layer 150 can create a blocking region, causing the current from the miller capacitance to flow into the emitter 130 instead of the gate 150.

The presence of the inversion shunt or channel 140 can affect the miller capacitance of the IGBT during turn off. For instance, if the inversion shunt 140 is allowed to exist when the IGBT 100 is turning off and collector current is still flowing, the natural feedback of the miller capacitance of the IGBT 100 can be bypassed. This can reduce the effect of miller capacitance on the rate of voltage changes (dv/dt) of the collector-emitter voltage, allowing the IGBT 100 to potentially have an overvoltage of the collector-emitter voltage during turn off.

In addition, quicker turn on of the IGBT can lead to "snap off" behavior of a freewheeling diode coupled in parallel with the other IGBT of a phase leg during reverse recovery of the diode. The "snap off" behavior (i.e. high rate of change (di/dt) of reverse recovery current in the diode) can lead to voltage spikes. This in turn can lead to damage the diode and can ultimately cause a circuit failure.

Thus, a need exists for an gate drive circuit and method that can provide for improved control of the rate of voltage changes (dv/dt) of the collector-emitter voltage during semiconductor turn off. A gate drive circuit and method that provides for control of voltage change rates of the collector-emitter voltage during a period of time when a freewheeling diode is experiencing diode reverse recovery would be particularly useful.

BRIEF DESCRIPTION OF THE INVENTION

Aspects and advantages of the invention will be set forth in part in the following description, or may be obvious from the description, or may be learned through practice of the invention.

One example aspect of the present disclosure is directed to a gate drive circuit for applying a gate voltage to a gate of a transistor. The gate drive circuit includes a gate resistor and an active gate control circuit. The active gate control circuit is configured to apply a first voltage via the gate resistor to the gate of the transistor to turn on the transistor. The first voltage is greater than a threshold voltage for the transistor. The active gate control circuit is further configured to apply a second voltage via the gate resistor to the gate of the transistor to turn off the transistor. The second voltage is less than the threshold voltage. During turn off of the transistor, the active gate control circuit is further configured to apply a third voltage to the gate of the transistor for a first turn off period. The third voltage is less than the first voltage but greater than the second voltage. The active gate control circuit is further configured to apply a fourth voltage to the gate of the transistor for a second turn off period. The fourth voltage is less than the third voltage but greater than the second voltage.

Another example aspect of the present disclosure is directed to a bridge circuit used in a power converter of a power system. The bridge circuit includes a first transistor having a gate, a collector, and an emitter. The bridge circuit further includes a second transistor coupled in series with the first transistor and a diode coupled in parallel with the first transistor. The bridge circuit further comprises a gate drive circuit configured to apply a voltage to the gate of the first transistor. The gate drive circuit comprising a gate resistor and an active gate control circuit. The active gate control circuit is configured to apply a first voltage via the gate resistor to the gate of the transistor to turn on the first transistor. The first voltage is greater than a threshold voltage for the first transistor. The active gate control circuit further configured to provide a second voltage via the gate resistor to the gate of the first transistor to turn off the first transistor. The second voltage is less than the threshold voltage. The active gate control circuit is further configured to apply a third voltage to the gate of the first transistor for a first turn off period. The third voltage is less than the first voltage but greater than the second voltage. The active gate control circuit further configured to provide a fourth voltage to the gate of the first transistor for a second turn off period. The fourth voltage is less than the third voltage but greater than the second voltage.

A further example aspect of the present disclosure is directed to a method of gating an insulated gate bipolar transistor (IGBT). The method includes a applying a first voltage via a gate resistor to a gate of the IGBT to turn on the transistor. The first voltage is greater than a threshold voltage for the IGBT. The method further includes receiving a turn off signal to turn off the IGBT. Subsequent to receiving the turn off signal, the method includes applying a second voltage via the gate resistor to the gate of the IGBT to turn off the IGBT. The second voltage is less than the threshold voltage. During turn off of the IGBT, the method further comprises applying one or more intermediate voltages near the threshold voltage to control the IGBT in a small signal manner, for instance, to control the rate of change of collector-emitter voltage and/or the rate of change of collector current for the IGBT.

Variations and modifications can be made to these example aspects of the present disclosure.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Generally, example aspects of the present disclosure are directed to high performance gate drives for driving semiconductor switching elements, such as insulated gate bipolar transistors (IGBTs). The gate drive circuits and methods according to aspects of the present disclosure can provide for improved control of rate of collector-emitter voltage changes (dv/dt) and/or rate of collector current changes (di/dt) during turn off. As a result, the peak voltage across the IGBT at turn off can be more effectively controlled, leading to the ability to have faster switching times and reduced switching losses of the IGBT through the use of lower values of gate resistance. The present disclosure is discussed with reference to driving IGBTs for purposes of illustration and discussion. Those of ordinary skill in the art, using the disclosures provided herein, will understand that certain aspects of the present disclosure are also applicable to other semiconductor switching devices.

An example high performance gate drive according to embodiments of the present disclosure can control the gate voltage applied to the gate of the IGBT to one or more intermediate voltages between the IGBT gate "On" voltage and the gate "Off" voltage. For instance, the intermediate voltage level can be applied by the gate drive circuit as long as the collector current for the IGBT is non-zero. In addition, a passive feedback network can be provided between the collector and the gate of the IGBT to provide a high bandwidth feedback loop.

According to particular aspects of the present disclosure, the gate-emitter voltage of the IGBT can be controlled in a small signal manner during IGBT turn off More particularly, the gate-emitter voltage can be slightly below the threshold voltage so that the current from the dv/dt through the miller capacitance makes the gate voltage at the IGBT itself to be near the threshold voltage. When the IGBT is controlled in a small signal manner during turn off, the IGBT can be an effective snubber circuit for a freewheeling diode coupled in parallel with the IGBT which can be physically very close to the IGBT.

Aspects of the present disclosure will now be discussed with reference to applying a first voltage, a second voltage, a third voltage, and a fourth voltage to a gate of an IGBT. The use of the terms "first," "second," "third", and "fourth" are used to differentiate between the voltage levels and are not used to indicate either magnitude or order of sequence of the voltages applied to the gate of the IGBT.

More particularly, a high performance gate drive circuit according to an example embodiment of the present disclosure can include an active gate control circuit configured to apply a first voltage above the threshold voltage of the IGBT to the gate of the IGBT to turn on the IGBT and to apply a second voltage below the threshold voltage of the IGBT to the gate of the IGBT to turn off the IGBT. The second voltage can be the lowest of all voltages applied to the gate of the IGBT. When the first voltage or the second voltage is applied to the gate of the IGBT, the IGBT is operated in a large signal manner, effectively causing the IGBT to be fully on during application of the first voltage or fully off during application of the second voltage.

During IGBT turn off, the IGBT can be controlled in a small signal manner such that the gate-emitter voltage of the IGBT is near the threshold voltage. More particularly, a third voltage can be applied to the gate of the IGBT by the gate driver circuit to control dv/dt of the collector-emitter voltage and di/dt of the collector current during a first turn off period. The third voltage can be a positive voltage that is less than the first voltage and greater than the second voltage.

In addition, a fourth voltage can be applied to the gate of the IGBT during a second turn off period that is subsequent to the first turn off period. The fourth voltage can be less than the third voltage and greater than the second voltage. The second turn off period can correspond to a period of reverse recovery of a freewheeling diode coupled in parallel with the IGBT. The fourth voltage can provide protection to the diode during reverse recovery. For instance, the fourth voltage can be applied to protect the diode from transient reverse voltage as a result of diode "snap off" behavior. The fourth voltage can be set to allow normal diode dv/dt of the collector-emitter voltage plus margin so that only the high dv/dt that occurs during "snap off" is limited by the feedback loop of the miller capacitance in the IGBT.

Figure 2:
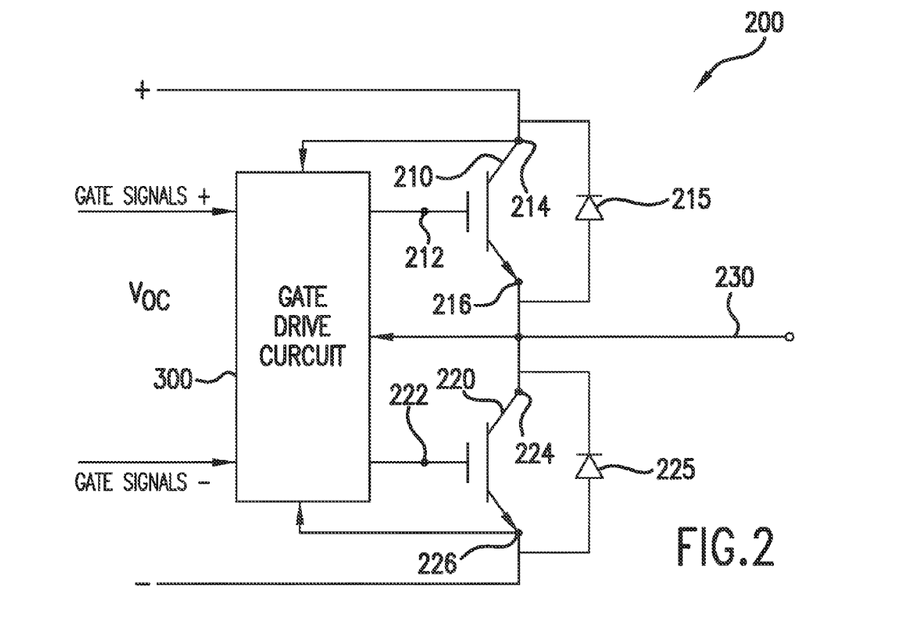
FIG. 2 depicts an example bridge circuit according to an embodiment of the present disclosure

With reference now to the FIGS., example embodiments of the present disclosure will now be discussed in detail. FIG. 2 depicts an example bridge circuit 200 that can be used, for instance, in a power converter. The bridge circuit 200 includes a first IGBT 210 (e.g. an "upper" IGBT) and a second IGBT 220 (e.g. a "lower" IGBT). The first IGBT 210 can include a gate 212, a collector 214, and an emitter 216. Similarly, the second IGBT 220 can include a gate 222, a collector 224, and an emitter 226.

A first freewheeling diode 215 can be coupled in parallel with the first IGBT 210. A second freewheeling diode 225 can be coupled in parallel with the second IGBT 220. The first freewheeling diode 215 and the second freewheeling diode 225 can exhibit reverse recovery characteristics when switching from a conducting state to a blocking state. More particularly, when switching from a conducting state to a blocking state, a large current can flow through the diode in the reverse direction for a short time until a reverse recovery charge is depleted.

The bridge circuit can include a gate drive circuit 300. The gate drive circuit 300 can control the gate-emitter voltages of the respective gates of the first IGBT 210 and the second IGBT 220 to control the switching of the first IGBT 210 and the second IGBT 220. For instance, the gate drive circuit 300 can provide pulse width modulation (PWM) commands to the first IGBT 210 and the second IGBT 220 to convert an alternating current power at the input 230 of the bridge circuit 200 to a direct current power or vice versa.

Figure 3:
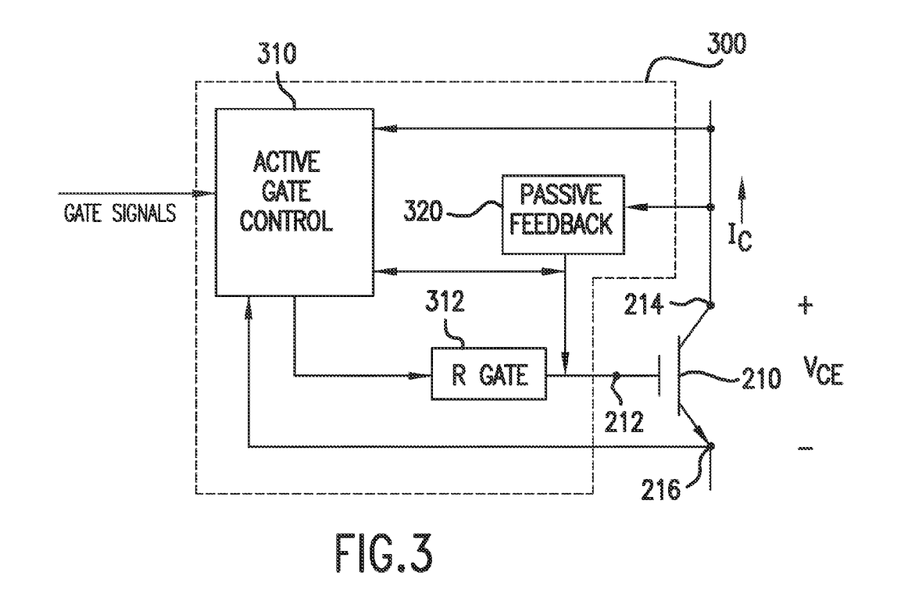
FIG. 3 depicts an example gate drive circuit for an IGBT according to an embodiment of the present disclosure.

FIG. 3 depicts an example gate drive circuit 300 according to an example embodiment of the present disclosure. The gate drive circuit 300 will be discussed with reference to controlling a gate-emitter voltage of the first IGBT 210. The gate drive circuit 300 can be configured to control the gate-emitter voltage of additional IGBTs, such as the second IGBT 220 shown in FIG. 2.

Referring back to FIG. 3, the gate drive circuit 300 includes an active gate control circuit 310. The active gate control circuit 310 can be configured to apply voltages, via a gate resistor 312, to the gate 212 of the IGBT 210 to control operation of the IGBT. The active gate control circuit 310 can include one or more control devices or circuits, such as one or more controllers, microprocessors, logic devices, memory units, microcontrollers, or other control devices. The active gate control circuit 310 can receive commands (e.g. PWM commands) from other system controllers, such as controller for a power generation system in which the gate drive circuit 300 is used.

In one example embodiment, the active gate control circuit 310 can include one or more processors and one or more computer-readable media. The one or more processors can be configured to execute computer-readable instructions stored in the one or more computer-readable media to cause the active gate control circuit 310 to perform operations, such as applying a voltage to the gate 212 of the IGBT 210 in accordance with example aspects of the present disclosure.

The active gate control circuit 310 can receive feedback elements from the IGBT 210. For instance, as shown the active gate control circuit 310 can received feedback of the collector current $I_C$ as well as the collector-emitter voltage $V_{CE}$ and gate-emitter voltage $V_{GE}$. Other active feedback elements can be included without deviating from the scope of the present disclosure.

In example embodiments, the gate drive circuit 300 can further include a passive feedback network 320. The passive feedback network 320 can include a passive feedback element coupled between the collector 214 of the IGBT 210 and the gate 212 of the IGBT 210. The passive feedback element can be, for instance, a capacitor. The passive feedback network 320 may be included to provide a high bandwidth feedback loop for control stability.

According to particular aspects of the present disclosure, the active gate control circuit 310 can provide four different voltage levels via the gate resistor 312 to the gate 212 of the IGBT 210. The four different voltage levels correspond to four different operating modes of the IGBT 210.

A first operating mode can be an "IGBT ON" operating mode of the IGBT 210. The IGBT ON mode can correspond to a period of time when the IGBT 210 is turned on such that current flows through the collector 214 and emitter 216 of the IGBT 210. During the IGBT ON mode, the active gate control circuit 310 can apply a first voltage in a large signal manner to the gate 212 of the IGBT 210. The first voltage can be sufficiently greater than the threshold voltage for the IGBT 210 so that the IGBT 210 is fully on. For instance, the first voltage can be in the range of about 10V to about 15V, such as about 15V. As used herein, the term "about" used in relation with a specified value is intended to refer to within 20% of the specified value.

A second operating mode can be an "IGBT OFF" operating mode of the IGBT 210. The IGBT OFF mode can correspond to a period of time when the IGBT 210 is turned off such that current flowing through the collector 214 and emitter 216 of the IGBT 210 is limited. During the IGBT OFF mode, the active gate control circuit 210 can apply a second voltage in a large signal manner to the gate 212 of the IGBT 210. The second voltage can be sufficiently less than the threshold voltage for the IGBT 210 so that the IGBT is fully off. For instance, the second voltage can be in the range of about −2V to about −7V, such as about −7V.

During turn off of the IGBT 210 (e.g. transitioning from the IGBT ON mode to the IGBT OFF mode), the active gate control circuit 310 can control the IGBT in a small signal manner by controlling the gate-emitter voltage of the IGBT 210 to be near the threshold voltage. More particularly, the active gate control circuit 310 can operate the IGBT 210 in an "IGBT Turn-Off" mode for a first turn off time period. Subsequent to the first turn off period, the active gate control circuit can transition to operate the IGBT 210 in a "Diode Recovery" mode for a second turn off time period.

The IGBT Turn-Off mode can correspond to a period of time when the IGBT 210 is turning off. During the IGBT Turn-Off mode, the active gate control circuit 210 can apply a third voltage to the gate 212 of the IGBT 210. The third voltage can be a voltage near the threshold voltage to control the IGBT 210 in a small signal manner, such as a positive voltage (e.g. a voltage greater than 0V) that is less than the first voltage and greater than the second voltage. For instance, the third voltage can be in the range of about 0V to about 8V, such as about 4V. The active gate control circuit 210 can operate the IGBT 210 in an IGBT Turn-Off Mode while a non-zero collector current $I_c$ is flowing in the collector 214 of the IGBT 210 to reduce dv/dt of the collector-emitter voltage $V_{CE}$ during turn off. The reduction of dv/dt can limit voltage peaks in the collector-emitter voltage $V_{CE}$.

The Diode Recovery mode can correspond to a period of time of diode reverse recovery of the freewheeling diode coupled in parallel with the IGBT 210. During the Diode Recovery mode, the active gate control circuit 210 can apply a fourth voltage to the gate 212 of the IGBT 210. The fourth voltage can be a voltage near the threshold voltage of the IGBT 210 to control the IGBT 210 in a small signal manner, such as a positive voltage (e.g. a voltage greater than 0V) that is less than the third voltage and greater than the second voltage. For instance, the fourth voltage can be in the range of about 1V to about 5V, such as about 1V. The fourth voltage can be applied for a time sufficient for the freewheeling diode to deplete its reverse recovery charge, at which point the active gate control circuit can apply the second voltage to operate the IGBT 210 in the IGBT OFF mode.

Figure 4:
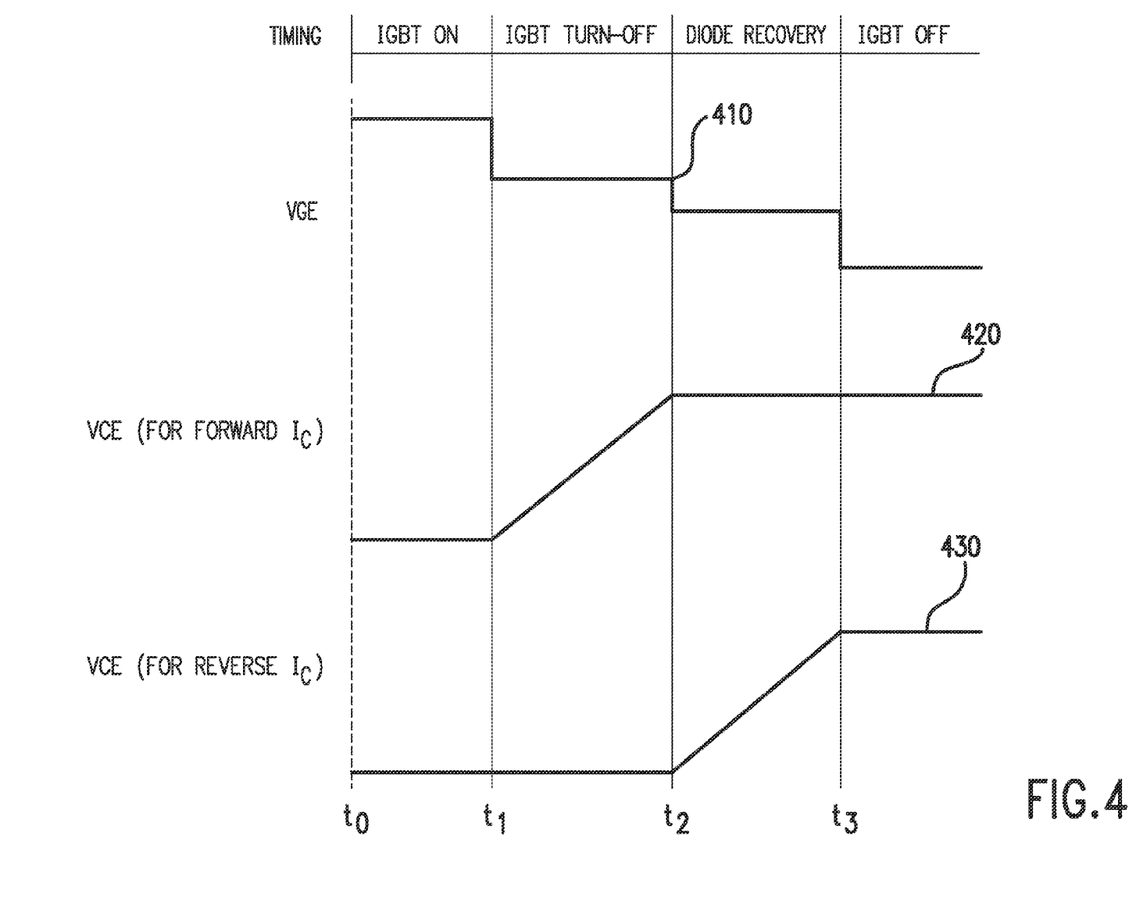
FIG. 4 depicts an example gate drive waveform that can be applied by an active gate control circuit according to an embodiment of the present disclosure.

FIG. 4 depicts a graphical representation of a voltage waveform 410 applied by the active gate control circuit 310 during turn off of the IGBT 210. Waveform 410 represents the voltage applied by the active gate control circuit to the gate 212 of the IGBT 210. As shown, the active gate control circuit 310 can apply a first voltage from time $t_0$ to time $t_1$ to operate the IGBT 210 in an IGBT ON mode. The active gate control circuit 310 can apply a second voltage after a time $t_3$ to operate the IGBT 210 in an IGBT OFF mode. Between the IGBT ON mode and the IGBT OFF mode, the active gate control circuit 310 can apply a third voltage to the gate 212 of the IGBT 210 to operate the IGBT 210 in a IGBT Turn-Off Mode for a first turn off period from time $t_1$ to time $t_2$. Subsequent to the first turn off period, the active gate control circuit 310 can apply a fourth voltage to the gate 212 of the IGBT 210 to operate the IGBT 210 in a Diode Recovery mode for a second turn off period from time $t_2$ to time $t_3$.

FIG. 4 further depicts two cases of collector-emitter voltage ($V_{CE}$) resulting from driving the IGBT 210 in accordance with waveform 410. Waveform 420 represents $V_{CE}$ for current flowing in the IGBT 210 (forward collector current $I_C$). Waveform 430 represent $V_{CE}$ for current flowing in a freewheeling diode coupled in parallel with the IGBT 210 (reverse collector current $I_C$).

The transition between the first turn off period corresponding to the IGBT Turn-Off mode to the second turn off period corresponding to the Diode Recovery mode occurs at transition time $t_2$. The transition time $t_2$ can correspond to a time when diode reverse recovery begins to occur. For instance, in the example bridge circuit 200 depicted in FIG. 2, the transition time $t_2$ can occur when the other IGBT in the bridge circuit 200 is turned on. For instance, if the freewheeling diode 215 is conducting, the transition time $t_2$ can occur when the second IGBT 220 is turned on. If the freewheeling diode 225 is conducting, the transition time $t_2$ can occur when the first IGBT 210 is turned on.

In one example embodiment, the active gate control circuit 310 can be configured to transition between the first turn off period and the second turn off period at a predetermined time. More particularly, the length of the IGBT Turn-Off mode period can be a fixed value determined based on the longest turn-off time of the IGBT 210. The transition time $t_2$ can be a predetermined value based on the length of the IGBT Turn-Off mode period. The length of the Diode Recovery mode period can also be a fixed value determined based on the longest period of reverse recovery of the freewheeling diode 215 coupled in parallel with the IGBT 210.

In other example embodiments, as shown in FIG. 3, the length of the first turn off period corresponding to the IGBT Turn-Off mode and the length of the second turn off period corresponding to the Diode Recovery mode can be determined based on monitored parameters of the system. For example, the active gate control circuit 310 can be configured to transition from the first turn off period to the second turn off period based at least in part on a signal indicative of the other IGBT in the bridge circuit being turned on.

As another example, the length of the first turn off period and the length of the second turn off period can be controlled by the active gate control circuit 310 based at least in part on the collector current $I_c$ of the IGBT 210. For instance, the active gate control circuit 310 can monitor collector current $I_C$ using a suitable current sensor. The active gate control circuit 310 can be configured to apply a third voltage for at least a period while the collector current $I_c$ is non-zero. The active gate control circuit 310 can be configured to transition between the first turn off period and the second turn off period based at least in part on the direction of the collector current $I_c$ (e.g. whether the collector current is positive or negative). The active gate control circuit 310 can control the gate-emitter voltage of the IGBT 210 based on other suitable monitored parameters, such as temperature, collector current, DC bus voltage, di/dt of collector current, dv/dt of collector-emitter voltage, and other suitable implementations.

In yet another example, the transition between the third voltage and the fourth voltage can occur at least in part as a result of a termination of a miller plateau current resulting from completion of the turn off dv/dt of the IGBT 210. More particularly, during turn off of the IGBT 210. More particularly, a miller plateau current resulting from dv/dt of the IGBT 210 can be extracted during turn off of the transistor during application of the third voltage. When the dv/dt of the IGBT 210 is complete, the miller plateau voltage can no longer feed the gate of the IGBT 210, resulting in a transition to the fourth voltage. Where the miller Plateau voltage can accept and source current near the gate threshold voltage, it can be used to in order to create the third or fourth voltage.

Figure 5:
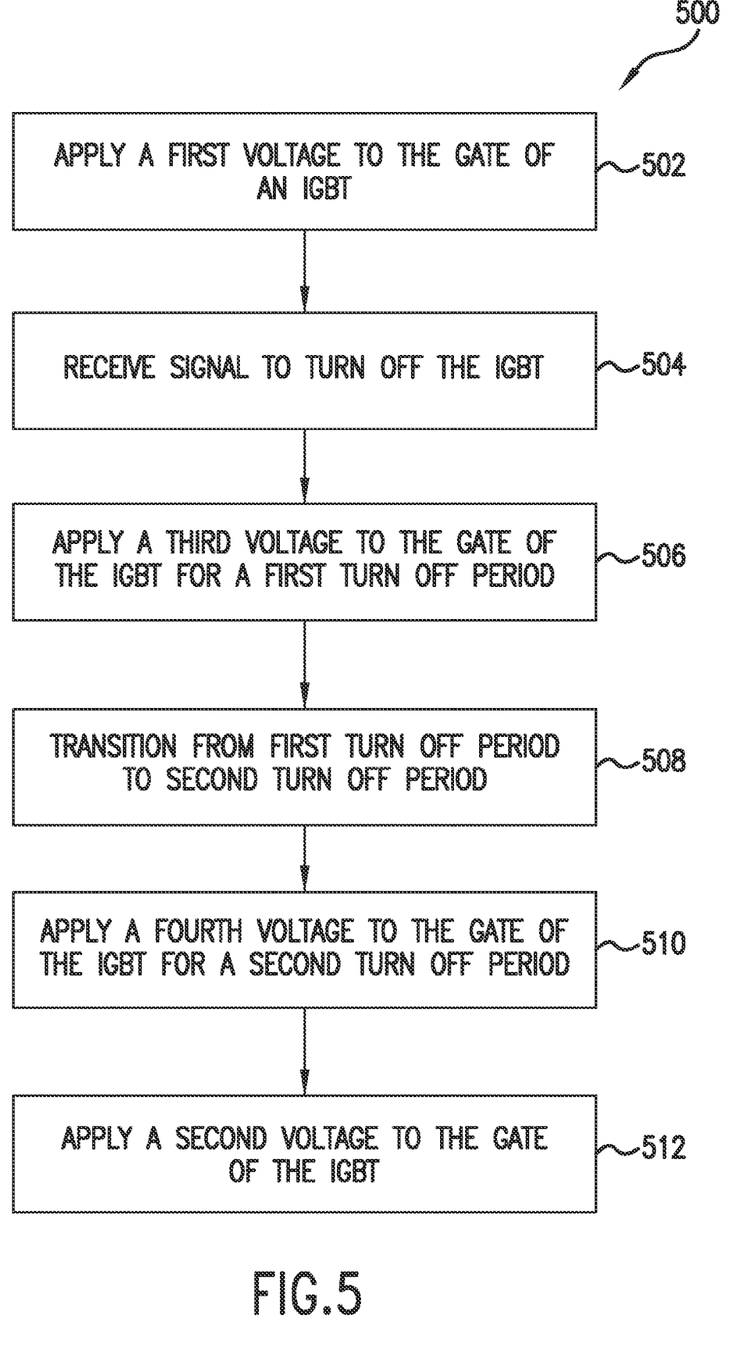
FIG. 5 depicts a flow diagram of an example method for gating an IGBT according to an embodiment of the present disclosure.

FIG. 5 depicts a flow diagram of an example method (500) of gating an IGBT according to an example embodiment of the present disclosure. At (502), the method includes applying a first voltage to a gate of an IGBT. The first voltage can be sufficiently greater than a threshold voltage for the IGBT so that the IGBT is fully on. At (504), a signal to turn of the IGBT can be received. The signal can be received from a suitable control system and can be part of, for instance, PWM commands used to control the switching of the IGBT. The signal can initiate turn off of the IGBT where a second voltage is applied to the gate of the IGBT to turn off the IGBT (512). The second voltage can be sufficiently less than the threshold voltage of the IGBT such that the IGBT is fully off.

During turn off of the IGBT, the method can include applying a third voltage to the gate of the IGBT for a first turn off period (506). The third voltage can be less than the first voltage and greater than the second voltage. The third voltage can be sufficiently near the threshold voltage of the IGBT so that the IGBT acts as an effective snubber circuit for a diode coupled in parallel with the IGBT. The third voltage can control dv/dt of the collector-emitter voltage and di/dt of the collector current of the IGBT during turn off.

Subsequent to applying the third voltage, the method can include transitioning from a first turn off period to a second turn off period (508). For example, the method can include transitioning between the first turn off period to the second turn off period at a predetermined time (e.g. determined based on fixed periods for the first turn off period and the second turn off period). As another example, the method can include transitioning between the first turn off period and the second turn off period when a second IGBT coupled in series with the IGBT is turned on. As yet another example, the method can include transitioning between the first turn off period to the second turn off period based on a collector current of the IGBT or based on other monitored parameters, such as temperature, collector current, DC bus voltage, di/dt of collector current, dv/dt of collector-emitter voltage, and other suitable At (510), the method includes applying a fourth voltage to the gate of the IGBT for a second turn off period. The second turn off period can correspond to a period of reverse recovery of a freewheeling diode coupled in parallel with the IGBT. The fourth voltage can be less than third voltage and greater than the second voltage. The fourth voltage can control dv/dt of the collector-emitter voltage of the IGBT during diode reverse recovery. At (512), the second voltage is applied to the gate of the IGBT to turn off the IGBT.

Figure 6:
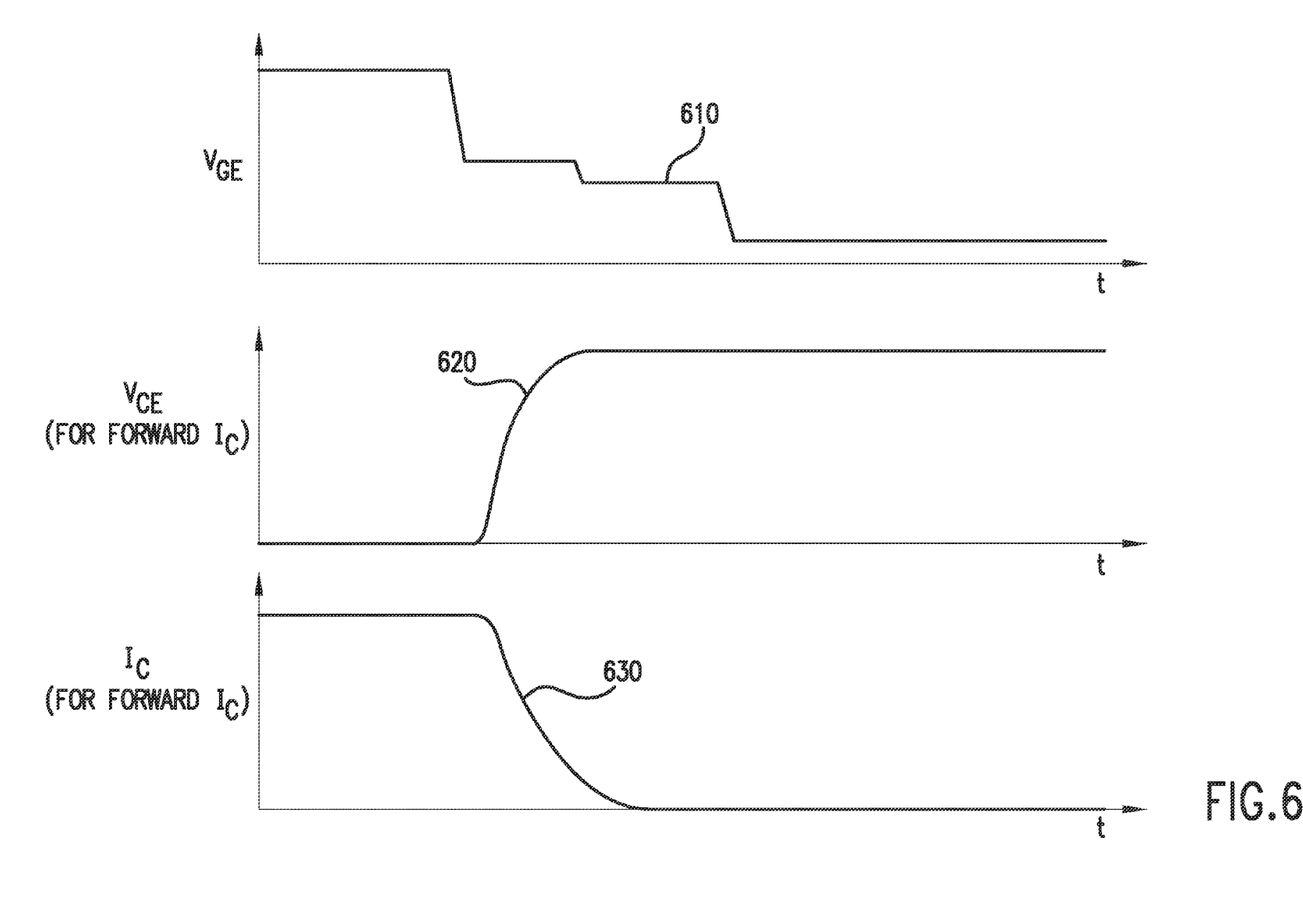
FIGS. 6 and 7 depict simulation results for an example gate drive circuit for an IGBT according to an example embodiment of the present disclosure.
Figure 7:
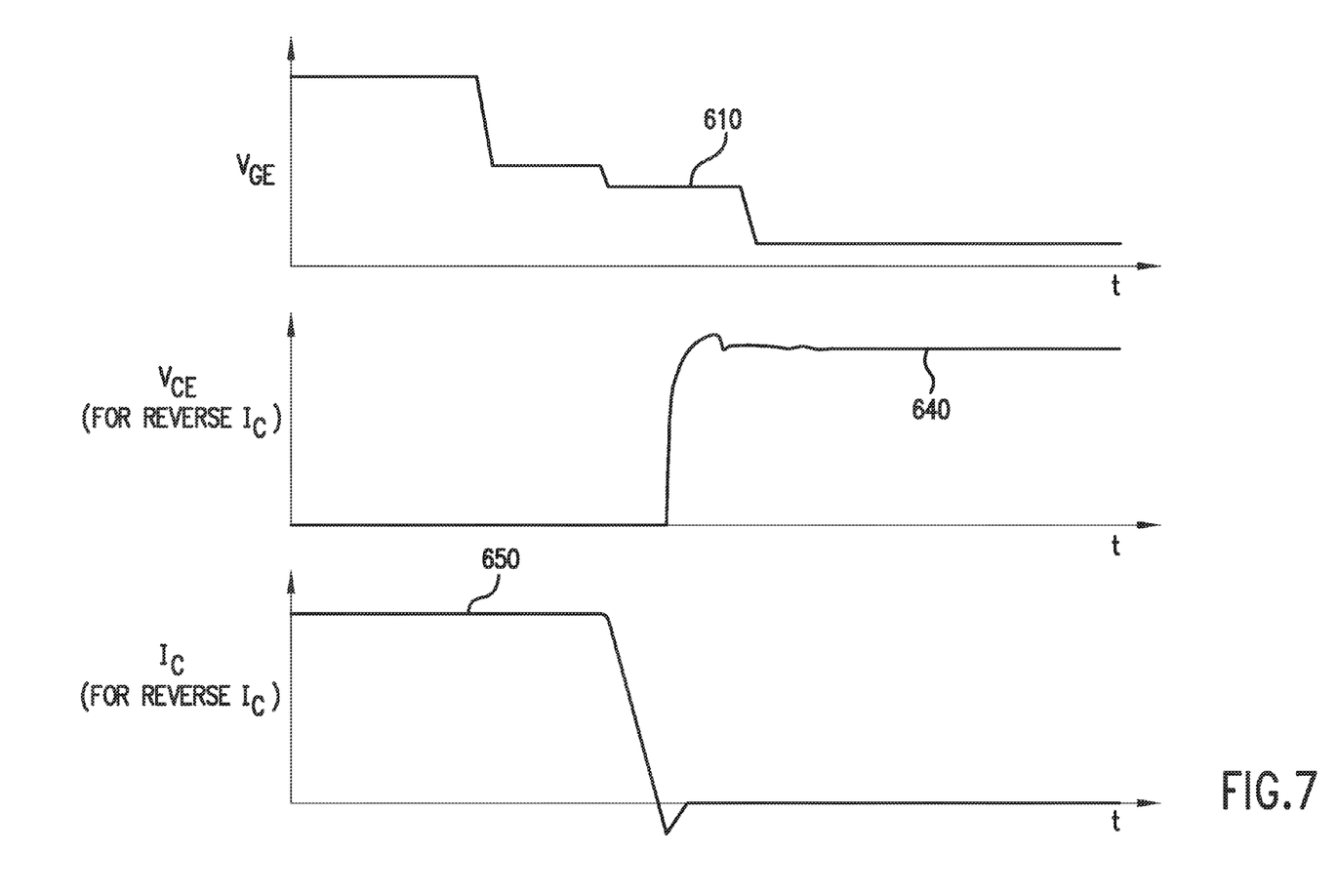

FIGS. 6 and 7 depict simulation results for an example gate drive circuit for an IGBT according to an embodiment of the present disclosure. Waveform 610 depicts the voltage applied by an example active gate control circuit to the gate of an IGBT. As shown, the active gate control circuit can apply a voltage of about 15V when the IGBT is turned on, a voltage of about 4V for the first turn off period, a voltage of about 1V for the second turn off period, and a voltage of about −7V when the IGBT is turned off.

Waveform 620 of FIG. 6 depicts the collector-emitter voltage $V_{CE}$ associated with forward flowing collector current (e.g. current in the IGBT) during turn off. Waveform 630 of FIG. 6 depict collector current $I_C$ for forward flowing collector current. Waveform 640 of FIG. 7 depicts the collector-emitter voltage $V_{CE}$ associated with reverse flowing collector current (e.g. current in freewheeling diode) during turn off. Waveform 650 of FIG. 7 depicts the collector current $I_C$ for reverse flowing collector current. As demonstrated, the active gate control transitions from the first turn off period where 4V is applied to a second turn off period where 1V is applied for diode reverse recovery when the collector current reaches about zero. The collector-emitter voltage exhibits good dv/dt characteristics with no significant overvoltage condition. The collector current $I_C$ also exhibits good di/dt characteristics during the first and second turn off periods.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A gate drive circuit for applying a gate voltage to a gate of a transistor, the gate drive circuit comprising:
    a gate resistor;
    an active gate control circuit, the active gate control circuit configured to apply a first voltage via the gate resistor to the gate of the transistor to turn on the transistor, the first voltage being greater than a threshold voltage for the transistor, the active gate control circuit further configured to apply a second voltage via the gate resistor to the gate of the transistor to turn off the transistor, the second voltage being less than the threshold voltage;
    wherein during turn off of the transistor, the active gate control circuit is further configured to apply a third voltage to the gate of the transistor for a first turn off period, the third voltage being less than the first voltage but greater than the second voltage, the active gate control circuit further configured to apply a fourth voltage to the gate of the transistor for a second turn off period, the second turn off period corresponding to a period of reverse recovery of a diode coupled in parallel with the transistor, the fourth voltage being less than the third voltage but greater than the second voltage;
    wherein the active gate control circuit is configured to receive a feedback signal indicative of a collector current of the transistor.

2. The gate drive circuit of claim 1, wherein the gate drive circuit further comprises a passive feedback element coupled between a collector of the transistor and the gate of the transistor.

3. The gate drive circuit of claim 1, wherein the passive feedback element comprises a capacitor.

4. The gate drive circuit of claim 1, wherein the transistor is an insulated gate bipolar transistor (IGBT).

5. The gate drive circuit of claim 1, wherein the active gate control circuit is configured to transition between the first turn off period and the second turn off period at a predetermined time.

6. The gate drive circuit of claim 1, wherein the active gate control circuit is configured to transition between the first turn off period and the second turn off period based at least in part on one or more of temperature, collector current, DC bus voltage, di/dt of collector current, dv/dt of collector-emitter voltage.

7. The gate drive circuit of claim 1, wherein the transition between the third voltage and the fourth voltage occurs at least in part as a result of a termination of a miller plateau current resulting from completion of the turn off dv/dt of the transistor.

8. A bridge circuit used in a power converter of a power system, the bridge circuit comprising:
    a first transistor having a gate, a collector, and an emitter;
    a second transistor coupled in series with the first transistor;
    a diode coupled in parallel with the first transistor;
    a gate drive circuit configured to apply a voltage to the gate of the first transistor, the gate drive circuit comprising a gate resistor and an active gate control circuit, the active gate control circuit configured to receive a feedback signal indicative of a collector current of the first transistor;
    wherein the active gate control circuit is configured to apply a first voltage via the gate resistor to the gate of the transistor to turn on the first transistor, the first voltage being greater than a threshold voltage for the first transistor, the active gate control circuit further configured to apply a second voltage via the gate resistor to the gate of the first transistor to turn off the first transistor, the second voltage being less than the threshold voltage;

wherein the active gate control circuit is further configured to apply a third voltage to the gate of the first transistor for a first turn off period, the third voltage being less than the first voltage but greater than the second voltage, the active gate control circuit further configured to apply a fourth voltage to the gate of the first transistor for a second turn off period, the second turn off period corresponding to a time sufficient for a freewheeling diode to deplete a reverse recovery charge, the fourth voltage being less than the third voltage but greater than the second voltage.

9. The bridge circuit of claim 8, wherein the gate drive circuit further comprises a passive feedback element coupled between a collector of the first transistor and the gate of the first transistor.

10. The bridge circuit of claim 8, wherein the active gate control circuit is configured to transition between the first turn off period and the second turn off period at a predetermined time.

11. The bridge circuit of claim 8, wherein the active gate control circuit is configured to transition between the first turn off period and the second turn off period at a time when the second transistor is turned on.

12. The bridge circuit of claim 8, wherein the active gate control circuit is configured to transition between the first turn off period and the second turn off period based at least in part on a collector current of the first transistor.

13. The gate drive circuit of claim 8, wherein the bridge circuit is used in a power converter of a wind-driven power generation system.

14. A method of gating an insulated gate bipolar transistor (IGBT) used in a power converter of a wind-driven power generation system, the method comprising:

applying a first voltage via a gate resistor to a gate of the IGBT to turn on the transistor, the first voltage being greater than a threshold voltage for the IGBT;

receiving a turn off signal to turn off the IGBT;

subsequent to receiving the turn off signal, applying a second voltage via the gate resistor to the gate of the IGBT to turn off the IGBT, the second voltage being less than the threshold voltage;

wherein during turn off the IGBT, the method further comprises applying one or more intermediate voltages near the threshold voltage to control the IGBT based at least in part on a feedback signal indicative of a collector current of the IGBT, at least one of the intermediate voltages applied for a time sufficient for a freewheeling diode to deplete a reverse recovery charge.

15. The method of claim 14, wherein applying one or more intermediate voltages near the threshold voltage to control the IGBT in a small signal manner comprises:

applying a third voltage to the gate of the IGBT for a first turn off period, the third voltage being less than the first voltage but greater than the second voltage; and applying a fourth voltage to the gate of the IGBT for a second turn off period subsequent to the first turn off period, the fourth voltage being less than the third voltage but greater than the second voltage.

16. The method of claim 15, wherein the second turn off period corresponds to a period of time of diode reverse recovery of a diode coupled in parallel with the IGBT.

17. The method of claim 15, wherein the one or more intermediate voltages are applied to control the rate of change of collector-emitter voltage of the IGBT during turn off.

18. The method of claim 15, wherein the one or more intermediate voltages are applied to control the rate of change of collector current of the IGBT during turn off.

* * * * *